United States Patent
Lin et al.

(10) Patent No.: US 10,269,762 B2
(45) Date of Patent: Apr. 23, 2019

(54) REWORK PROCESS AND TOOL DESIGN FOR SEMICONDUCTOR PACKAGE

(71) Applicant: Taiwan Semiconductor Manufacturing Company, Ltd., Hsin-Chu (TW)

(72) Inventors: Shih Ting Lin, Taipei (TW); Justin Huang, Hsin-Chu (TW); Tsung-Fu Tsai, Changhua (TW); Jing-Cheng Lin, Hsin-Chu (TW); Chen-Hua Yu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 627 days.

(21) Appl. No.: 14/926,780

(22) Filed: Oct. 29, 2015

(65) Prior Publication Data
US 2017/0125374 A1    May 4, 2017

(51) Int. Cl.
| | | |
|---|---|---|
| B23K 31/02 | (2006.01) | |
| H01L 23/00 | (2006.01) | |
| B23K 1/005 | (2006.01) | |
| B23K 1/012 | (2006.01) | |
| B23K 1/018 | (2006.01) | |

(Continued)

(52) U.S. Cl.
CPC ............ *H01L 24/98* (2013.01); *B23K 1/0053* (2013.01); *B23K 1/0056* (2013.01); *B23K 1/012* (2013.01); *B23K 1/018* (2013.01); *B23K 1/203* (2013.01); *B23K 3/029* (2013.01); *H01L 24/799* (2013.01); *B23K 1/0016* (2013.01); *H01L 24/75* (2013.01); *H01L 24/81* (2013.01); *H01L 2224/04105* (2013.01); *H01L 2224/12105* (2013.01); *H01L 2224/131* (2013.01); *H01L 2224/16238* (2013.01); *H01L 2224/32225* (2013.01); *H01L 2224/73267* (2013.01); *H01L 2224/7501* (2013.01); *H01L 2224/75252* (2013.01); *H01L 2224/75253* (2013.01); *H01L 2224/8101* (2013.01); *H01L 2224/81022* (2013.01); *H01L 2224/81024* (2013.01)

(58) Field of Classification Search
CPC ........ H01L 24/98; H01L 24/799; B23K 1/018
USPC ........................ 228/119, 191, 264, 13, 19–23
See application file for complete search history.

(56) References Cited

U.S. PATENT DOCUMENTS 3,731,866 A * 5/1973 Mason ............... H05K 13/0486
228/19
3,751,799 A * 8/1973 Reynolds ............... B23K 1/018
228/119

(Continued)

FOREIGN PATENT DOCUMENTS

DE    2319287 A * 2/1974
EP    0040669 A * 12/1981
(Continued)

*Primary Examiner* — Kiley S Stoner
(74) *Attorney, Agent, or Firm* — Slater Matsil, LLP

(57) ABSTRACT

A rework process includes attaching a first bond head to a first semiconductor package. The contact pads of the first semiconductor package are bonded to contact pads of a second semiconductor package by solder joints. The rework process further includes performing a first local heating process to melt the solder joints, removing the first semiconductor package using the first bond head, and removing at least a portion of solder from the contact pads of the second semiconductor package.

20 Claims, 12 Drawing Sheets

(51) Int. Cl.
*B23K 1/20* (2006.01)
*B23K 3/02* (2006.01)
*B23K 1/00* (2006.01)

(56) References Cited

U.S. PATENT DOCUMENTS

| | | | | |
|---|---|---|---|---|
| 4,321,738 A * | 3/1982 | Makhijani | H01L 21/4864 | 228/162 |
| 4,323,631 A * | 4/1982 | Spirig | B23K 3/08 | 228/19 |
| 4,444,559 A * | 4/1984 | Schink | B23K 1/018 | 257/E21.511 |
| 4,561,584 A * | 12/1985 | Hug | H05K 13/0486 | 228/119 |
| 4,564,135 A * | 1/1986 | Barresi | B23K 1/012 | 228/180.21 |
| RE32,086 E * | 2/1986 | Spirig | B23K 3/08 | 228/19 |
| 4,569,473 A * | 2/1986 | Guiliano | B23K 1/018 | 228/20.1 |
| 4,586,252 A * | 5/1986 | Faticanti | B23K 1/018 | 228/56.1 |
| 4,605,152 A * | 8/1986 | Fridman | B23K 1/012 | 228/180.21 |
| 4,610,388 A * | 9/1986 | Koltuniak | B23K 1/012 | 228/20.1 |
| 4,620,659 A * | 11/1986 | Holdway | B23K 1/012 | 228/191 |
| 4,696,096 A * | 9/1987 | Green | B23K 1/012 | 228/180.21 |
| 4,752,025 A * | 6/1988 | Stach | H05K 13/0486 | 228/191 |
| 4,769,083 A * | 9/1988 | Tiritilli | B23K 1/018 | 134/25.4 |
| 4,787,548 A * | 11/1988 | Abbagnaro | B23K 1/012 | 222/566 |
| 4,805,827 A * | 2/1989 | Coffman | B23K 1/012 | 228/20.1 |
| 4,813,589 A * | 3/1989 | Palmer | B23K 1/012 | 228/119 |
| 4,877,175 A * | 10/1989 | Jones | B23K 1/018 | 219/121.65 |
| 5,065,931 A * | 11/1991 | Liu | B23K 1/018 | 228/19 |
| 5,065,933 A * | 11/1991 | Basavanhally | B23K 1/018 | 228/102 |
| 5,102,028 A * | 4/1992 | Glovatsky | B23K 1/0016 | 228/105 |
| 5,219,520 A * | 6/1993 | Brofman | B22F 3/11 | 228/19 |
| 5,284,286 A * | 2/1994 | Brofman | B22F 3/11 | 228/119 |
| 5,423,931 A * | 6/1995 | Inoue | H05K 13/0486 | 156/701 |
| 5,549,240 A * | 8/1996 | Urban | B23K 1/018 | 228/19 |
| 5,603,857 A * | 2/1997 | Mickle | B23K 1/018 | 219/228 |
| 5,639,011 A * | 6/1997 | Jacks | B23K 1/012 | 228/180.21 |
| 5,715,592 A * | 2/1998 | Mori | H05K 13/0486 | 228/191 |
| 5,746,367 A * | 5/1998 | Pai | B23K 1/018 | 228/19 |
| 5,901,898 A * | 5/1999 | Strempke | B23K 1/018 | 228/19 |
| 5,909,838 A * | 6/1999 | Jimarez | B23K 1/018 | 228/125 |
| 6,062,460 A * | 5/2000 | Sato | H01L 21/4853 | 228/119 |
| 6,182,884 B1 * | 2/2001 | Ma | B23K 1/012 | 228/119 |
| 6,216,937 B1 * | 4/2001 | DeLaurentis | B23K 1/018 | 228/13 |
| 6,357,648 B1 * | 3/2002 | Monno | B23K 1/018 | 228/101 |
| 7,469,457 B2 * | 12/2008 | Ishikawa | H05K 13/0491 | 228/119 |
| 2001/0004990 A1 * | 6/2001 | Cox | B23K 1/018 | 228/19 |
| 2002/0033409 A1 * | 3/2002 | Cilia | B23K 1/018 | 228/19 |
| 2002/0084307 A1 * | 7/2002 | Ruszowski | B23K 1/018 | 228/51 |
| 2004/0041011 A1 * | 3/2004 | Bolde | B23K 1/018 | 228/264 |
| 2004/0041012 A1 * | 3/2004 | Bezama | B23K 1/018 | 228/264 |
| 2005/0087588 A1 * | 4/2005 | Weigler | B23K 1/018 | 228/264 |
| 2005/0112284 A1 * | 5/2005 | Rubin | B23K 1/018 | 427/372.2 |
| 2005/0224971 A1 * | 10/2005 | Suehiro | H01L 23/50 | 257/737 |
| 2006/0076388 A1 * | 4/2006 | Sato | B23K 1/018 | 228/102 |
| 2008/0169337 A1 * | 7/2008 | Callahan | B23K 1/018 | 228/264 |
| 2009/0321500 A1 * | 12/2009 | Okada | B23K 1/012 | 228/119 |
| 2011/0079634 A1 * | 4/2011 | Lee | B23K 1/0016 | 228/264 |
| 2011/0168761 A1 * | 7/2011 | Hwang | B23K 1/0016 | 228/13 |
| 2011/0240718 A1 * | 10/2011 | Cheung | B23K 1/018 | 228/264 |
| 2013/0008020 A1 * | 1/2013 | Park | B23K 1/0016 | 29/762 |
| 2013/0240608 A1 * | 9/2013 | Hsieh | H05K 13/0486 | 228/13 |
| 2017/0352640 A1 * | 12/2017 | Park | B23K 1/0016 | |

FOREIGN PATENT DOCUMENTS

| | | | | |
|---|---|---|---|---|
| JP | 55001105 A | * | 1/1980 | H01L 24/98 |
| JP | 01113171 A | * | 5/1989 | |
| JP | 2006303266 A | * | 11/2006 | H01L 24/98 |
| JP | 3918004 B2 | * | 5/2007 | H01L 24/98 |

* cited by examiner

REWORK PROCESS AND TOOL DESIGN FOR SEMICONDUCTOR PACKAGE

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area. As the demand for even smaller electronic devices has grown recently, there has grown a need for smaller and more creative packaging techniques of semiconductor dies.

An example of these packaging technologies is the Package-on-Package (PoP) technology. In a PoP package, a top semiconductor packages is stacked on top of a bottom semiconductor package (hereafter bottom package) to allow high level of integration and component density. This high level of integration from PoP technology enables production of semiconductor devices with enhanced functionalities and small footprints on the printed circuit board (PCB).

Integrated passive devices (IPDs) and technologies are gaining popularity recently. A wide variety of passive devices, such as baluns, couplers, splitters, filters and diplexers can be integrated in an IPD device. By replacing traditional discrete surface mount devices (SMDs) with IPDs, significant savings of PCB area can be achieved. At the same time, IPDs provide significant cost reductions and performance improvements over traditional SMDs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. Throughout the present disclosure, like numbers refer to similar parts, unless otherwise specified.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Rework processes and tool design for repairing semiconductor packages such as PoP packages is disclosed herein. In some embodiments, a first semiconductor package of a PoP package is removed by a bond head after the solder joints connecting the first semiconductor package and a bottom package is melted. After removal of the first semiconductor package, at least a portion of the solder left on contact pads of the bottom package is removed by a solder removal tool which comprises, e.g., a solder-wettable piece or a nozzle supplied with a vacuum. In some embodiments, a third semiconductor package is attached to the bottom package. The disclosed rework process and tool design can be used to repair semiconductor packages in different applications, e.g., a PoP package, or a semiconductor package attached to a PCB, and can be applied at wafer level or unit level rework process.

Figure 1:
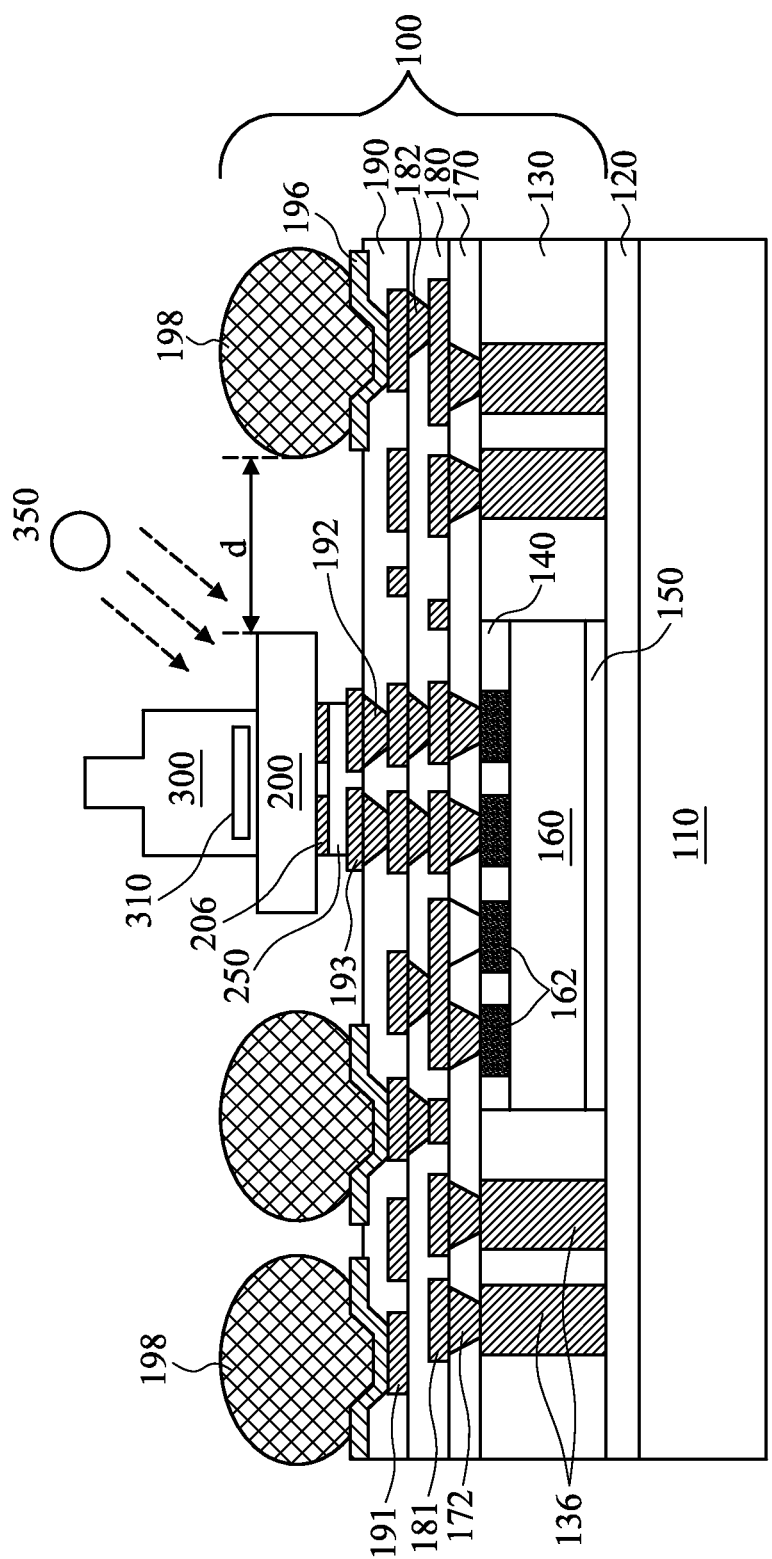
FIGS. 1, 2, 3B, 3B', 4, 4', and 5 illustrate cross-sectional views of a PoP package and rework tools at various stages of a rework process in accordance with some embodiments.

FIG. 1 illustrates a cross-sectional view of a PoP package comprising an IPD device 200 and a bottom package 100, with a bond head 300 attached to the IPD device 200, at various stages of a rework process in accordance with some embodiments. As illustrated in FIG. 1, a PoP package may comprise a first semiconductor package 200, which may be a semiconductor device such as an IPD device 200, and a bottom package 100. The contact pads 206 of the first semiconductor package 200 are bonded to contact pads 193 of the bottom package 100 by solder joints 250.

As illustrated in FIG. 1, the bottom package 100 comprises a semiconductor device 160 and is disposed on carrier 110, with a film 120 disposed between the bottom package 100 and the carrier 110. The semiconductor device 160 comprises electrical components such as one or more semiconductor dies, transistors, capacitors, resistors, inductors, or the like, which may be electrically connected to implement specific functions, in some embodiments. The bottom package 100 also comprises molding compound 130 that is formed over the film 120 and surrounds the semiconductor device 160, and through vias 136 embedded in the molding compound 130, in some embodiments. The bottom package 100 further comprises one or more redistribution layers (RDLs) (e.g., RDLs 170 and 180), contact pads (e.g. contact pads 191 and 193), passivation layer 190, under bump metallurgy (UBM) pad 196, and connectors 198, in some embodiments. More details of the bottom package 100 are discussed hereafter.

The carrier 110 of bottom package 100 may comprise glass, silicon oxide, aluminum oxide, or a semiconductor wafer, as examples. The carrier 110 may also comprise other materials. The carrier 110 may be circular, square, or rectangular in a top view, as examples. Alternatively, the carrier 110 may comprise other shapes.

The carrier 110 has a film 120 formed thereon in some embodiments. The film 120 comprises a light to heat conversion (LTHC) material or other materials, for example. The LTHC film 120 may comprise a thickness of about 0.5

μm to about 3 μm, for example. Alternatively, the film 120 may comprise other dimensions. In some embodiments, the film 120 is not included.

An insulating material may be disposed over the film 120 (not shown in FIG. 1). The insulating material may be formed over the carrier 110 in embodiments wherein the film 120 is not included. The insulating material may comprise a passivation layer for the package. The insulating material comprises a glue/polymer base buffer layer in some embodiments, for example. The insulating material comprises a solder resist (SR), polyimide (PI), polybenzoxazole (PBO), or multiple layers or combinations thereof in some embodiments, as examples. The insulating material comprises a thickness of about 1 μm to about 20 μm, for example. Alternatively, the insulating material may comprise other materials and dimensions. The insulating material is formed using spin coating, lamination, or other methods, for example.

In accordance with some embodiments, a semiconductor device 160 is coupled to the carrier 110 over the film 120. Only one semiconductor device 160 is shown in FIG. 1, however, dozens, hundreds, or more semiconductor devices 160 may be coupled to carrier 110 and packaged simultaneously. The semiconductor device 160 includes a plurality of contact pads 162 formed across the front side. The contact pads 162 are electrically coupled to the semiconductor die(s) inside the semiconductor device 160, in some embodiments. The contact pads 162 comprise a conductive material such as copper, aluminum, other metals, or alloys or multiple layers thereof, as examples. Alternatively, the contact pads 162 may comprise other materials. In some embodiments, the contact pads 162 are surrounded by a molding material 140 comprising, e.g., an epoxy or an organic polymer. The back side of semiconductor device 160 is coupled to carrier 110 over the film 120. The semiconductor device 160 may be coupled to the film 120 using an adhesive 150, such as a die attach film (DAF), for example. The semiconductor devices 160 may be coupled to the film 120 manually or using an automated machine such as a pick-and-place machine.

As illustrated in FIG. 1, a molding material 130 is formed over the film 120 and surrounds the semiconductor device 160. The molding material 130 protects the semiconductor device 160 from outside environments such as moisture and physical impact, and may comprise an epoxy, an organic polymer, a polymer with or without a silica-based or glass filler added, or other materials, as examples. The molding material 130 may be molded using, for example, compressive molding, transfer molding, or other methods.

Embedded in the molding material 130 are a plurality of through vias 136 made of conductive materials such as copper, aluminum, copper or aluminum alloys, or other conductive materials. A top surface of the molding material 130 is coplanar with top surfaces of through vias 136 as well as top surfaces of contact pads 162 of the semiconductor device 160.

As shown in FIG. 1, a dielectric layer 170 is formed over the molding material 130 and the semiconductor device 160. The dielectric layer 170 may be formed, for example, of silicon dioxide, silicon nitride, low dielectric constant (low-K) dielectric material, compounds thereof, composites thereof, combinations thereof, or the like, by any suitable method, such as spinning, physical vapor deposition (PVD), chemical vapor deposition (CVD), and/or plasma-enhanced CVD (PECVD). Vias 172 are formed in the dielectric layer 170 to connect with through vias 136 and contact pads 162 of the semiconductor device 160, as examples.

In some embodiments, redistribution layers (RDLs) 180 and 190 are formed successively over the dielectric layer 170. RDL 190 may comprise a passivation layer for the PoP package, in accordance with some embodiments. The RDL 180 includes a plurality of conductive metal lines 181 and/or a plurality of conductive metal vias 182 formed inside the dielectric material of layer 180. The RDL 190 includes a plurality of conductive metal lines 191 and/or a plurality of conductive metal vias 192 formed inside the dielectric material of layer 190. The dielectric material(s) of RDLs 180 and 190 may be formed, for example, of a silicon dioxide, silicon nitride, phosphosilicate glass (PSG), borophosphosilicate glass (BPSG), fluorinated silicate glass (FSG), SiOxCy, spin-on-glass, spin-on-polymers, silicon carbon material, low-K dielectric material, compounds thereof, composites thereof, combinations thereof, or the like, by any suitable method, such as spinning, PVD, CVD, and/or PECVD.

Metal lines 191 of the RDL 190 may comprise contact pads 191 for the bottom package 100, which contact pads are exposed by openings in the RDL 190 and are electrically coupled to external connectors 198, in some embodiments. In the example shown in FIG. 1, under bump metallization (UBM) pads 196 are formed over the contact pads 191, and connectors 198 are formed on the UBM pads 196. The UBM pads 196 may be conformally formed over the contact pads 191 and the sidewalls of the openings exposing the contact pads 191, and may extend over a top surface of the RDL 190, in some embodiments. The UBM pads 196 may comprise a layer of conductive material, such as a layer of titanium, or a layer of nickel. The UBM pads 196 may comprise multiple sub-layers (not shown) made of materials such as titanium (Ti), titanium oxide (TiOx), tantalum (Ta), tantalum nitride (TaN), nickel (Ni), copper (Cu), multilayers thereof, or combinations thereof, and may be created using processes such as sputtering, evaporation, or CVD process, depending upon the desired materials. Alternatively, the UBM pads 196 may not be needed in some embodiments.

The connectors 198 may comprise solder balls, or other types of electrical connectors, such as controlled collapse chip connection (C4) bumps, or pillars, and may include conductive materials such as Cu, Sn, Ag, Pb, or the like. In some embodiments, the connectors 198 are not included on the PoP package.

In accordance with some embodiments, the RDL 190 comprises one or more contact pads 193 proximate a top surface of the RDL 190. The contact pads 193 are micro bump pads 193 and are used to connect with a semiconductor package 200 having micro bumps as external connectors, in some embodiments. The semiconductor package 200 may comprise a semiconductor device such as an IPD device 200, in accordance with some exemplary embodiments. Throughout the description herein, contacts pads 193 may be referred to as micro bump pads 193, and semiconductor package 200 may be referred to as IPD device 200, with the understanding that other types of contact pads 193 and other types of semiconductor devices or packages 200 are also contemplated within the scope of the present disclosure. Although FIG. 1 only illustrates one bottom package 100 with one IPD device 200 attached thereon, one skilled in the art will appreciate that more than one bottom packages 100 could be formed on carrier 110, and one or more IPD devices 200 may be attached to each bottom package 100. In addition, the bottom package 100 with the IPD device 200 attached thereon may be referred to as a PoP package throughout the description, with the understanding that further processing steps, such as removing carrier 110, removing at least a portion of film 120 to expose the through vias 136, and attaching another semiconductor package (e.g., a top semiconductor package) to the backside of the bottom package 100, may be needed to form a complete PoP package. In addition, dicing may be performed to form a plurality of individual PoP packages if the carrier 110 has multiple bottom packages 100 formed thereon, for example.

The IPD device 200 may have a small size of, e.g., 1×1 mm or smaller, although other sizes are also possible. In some embodiments, micro bumps (not shown) are formed on contact pads 206 of IPD device 200. In contrast to conventional solder balls such as those used in a ball grid array (BGA) connector, which may have a diameter ranging from, e.g., about 0.46 mm to about 0.76 mm, micro bumps have much smaller diameters ranging from, e.g., about 0.01 mm to about 0.05 mm. Micro bump pads 193, as known in the art, are appropriately small sized to accommodate the small size of micro bumps. During a subsequent bonding process, the micro bumps are bonded to micro bump pads 193 by, e.g., a thermo compression bonding process or a reflow process, and as a result of the bonding process, solder joints are formed which electrically and mechanically connect contact pads 206 of the IPD device 200 with micro bump pads 193 of the bottom package 100, in accordance with some embodiments. The small size of micro bumps allows fine pitches between micro bump pads 193 and enables high-density connections.

However, the small size of micro bump pads 193 and the fine pitches between micro bump pads 193 also entail certain challenges. For example, during the bonding process, solders joints on adjacent micro bump pads 193 may melt and merge together, forming unintended connections commonly referred to as solder bridges. FIG. 1 illustrates such a defect, where solder joints on two adjacent micro bump pads 193 merge and form a solder bridge 250. As another example, if too little solder is used when forming the solder joints between the IPD device 200 and the bottom package 100, unreliable connections commonly referred to as cold joints may occur. During manufacturing, testing could be performed after the bonding process to identify defective PoP packages, such as PoP packages with faulty connections between the IPD device 200 and the bottom package 100 (e.g., solder bridges or cold joints), or PoP packages with damaged IPD device 200. Instead of discarding the defective PoP packages, it may be economically beneficial to repair the defective PoP packages through a rework process by, for example, removing the IPD device 200, removing solder bridges from the micro bump pads 193, and bonding a replacement IPD device 210 to the bottom package 100 (see FIG. 5). However, in a PoP package having an IPD device 200, the keep out zone of the IPD device 200 (e.g., a distance between a perimeter of the IPD device 200 and a nearby component such as a connector 198, see label d in FIG. 1) is typically small, for example, less than about 150 μm. Conventional tools and rework processes are not designed to work with such a small keep out zone, and may damage nearby components if used for repairing the PoP packages. Another challenge for repairing defective PoP packages is the lack of effective ways to remove solder left on the micro bump pads 193 after the removal of the IPD device 200. Excessive amount of solder left on the micro bump pads 193 may form solder bridges, even before a replacement IDP device 210 is bonded to the bottom package 100. Or, if the excessive amount of solder is not removed, new solder bridges could form during a subsequent bonding processing to bond a replacement IPD device 210 to the bottom package 100.

FIGS. 1-5 illustrate a rework process and the tools used for repairing a defective PoP package, in accordance with some embodiments. As illustrated in FIG. 1, a bond head 300 is attached to the backside of the IPD device 200 by, e.g., a vacuum. A first local heating process is performed to melt the solder joints formed between the contact pads 206 of the IPD device 200 and the contact pads 193 (e.g., micro bump pads 193) of the bottom package 100, in some embodiments. A local heating process heats a targeted area of the PoP package instead of the whole PoP package. For example, the first local heating process heats only an area proximate the contact pads 193 of the bottom package 100, where solder joints between the IPD device 200 and the bottom package 100 are located, while minimizing or reducing the negative impact of heating on the integrity of other connectors or components of the PoP package. In some embodiments, the bond head 300 has a built-in heating element 310, such as electrical heating elements, for performing a local heating process. Besides the built-in heating element of the bond head, other suitable heat source (shown as heat source 350 in FIG. 1), such as infrared radiation, hot air, and laser may also be used to locally heat the solder joints for removal of the IPD device 200, as examples. In accordance with some embodiments, one or more suitable heat sources may be used, individually or in combination, for the local heating process. Using more than one heating sources may shorten the time needed to melt solder, in some embodiments. For clarity, heat source 350 may not be shown in subsequent processing steps, however, depending the processing performed, heat source 350 may be used for the purpose of local heating. Heat generated from the heat source(s) may be transferred to the solder joints by a variety of methods, such as conduction, convection, radiation, combinations thereof, as examples.

In some embodiments, the first local heating process starts after the bond head 300 is attached to the IPD device 200. In another embodiment, the first local heating process starts at the same time when the bond head 300 is attached to the IPD device 200. In other embodiments, the first local heating process starts before the bond head 300 is attached to the IPD device 200, which may shorten the time required to melt solder, thus reducing the total time required for repairing the PoP package. Parameters for the local heating process, such as the heating temperature and heating time, may be adjusted according to different design factors, e.g., the particular structure of the PoP package, the size of the area proximate the contact pads 193, solder composition, and volumes of solder to melt, as examples. In accordance with some embodiments, the first local heating process is performed at a temperature from a melting point of the solder to a temperature about 60° C. to 80° C. above the melting point of the solder. For example, for a lead free SAC305 solder, the local heating process may be performed at a temperature from about 217° C. to about 280° C. As another example, for a $S_nP_b$ solder, the local heating process may be performed at a temperature from about 183° C. to about 260° C. Factors such as the volume of the solder determine the heating time of the local heating process. In some embodiments, the local heating process is performed for about 1 second to about 60 seconds. After the solder joints melt and the IPD device 200 is removed (described hereafter), the first local heating process is stopped, in some embodiments.

Figure 2:
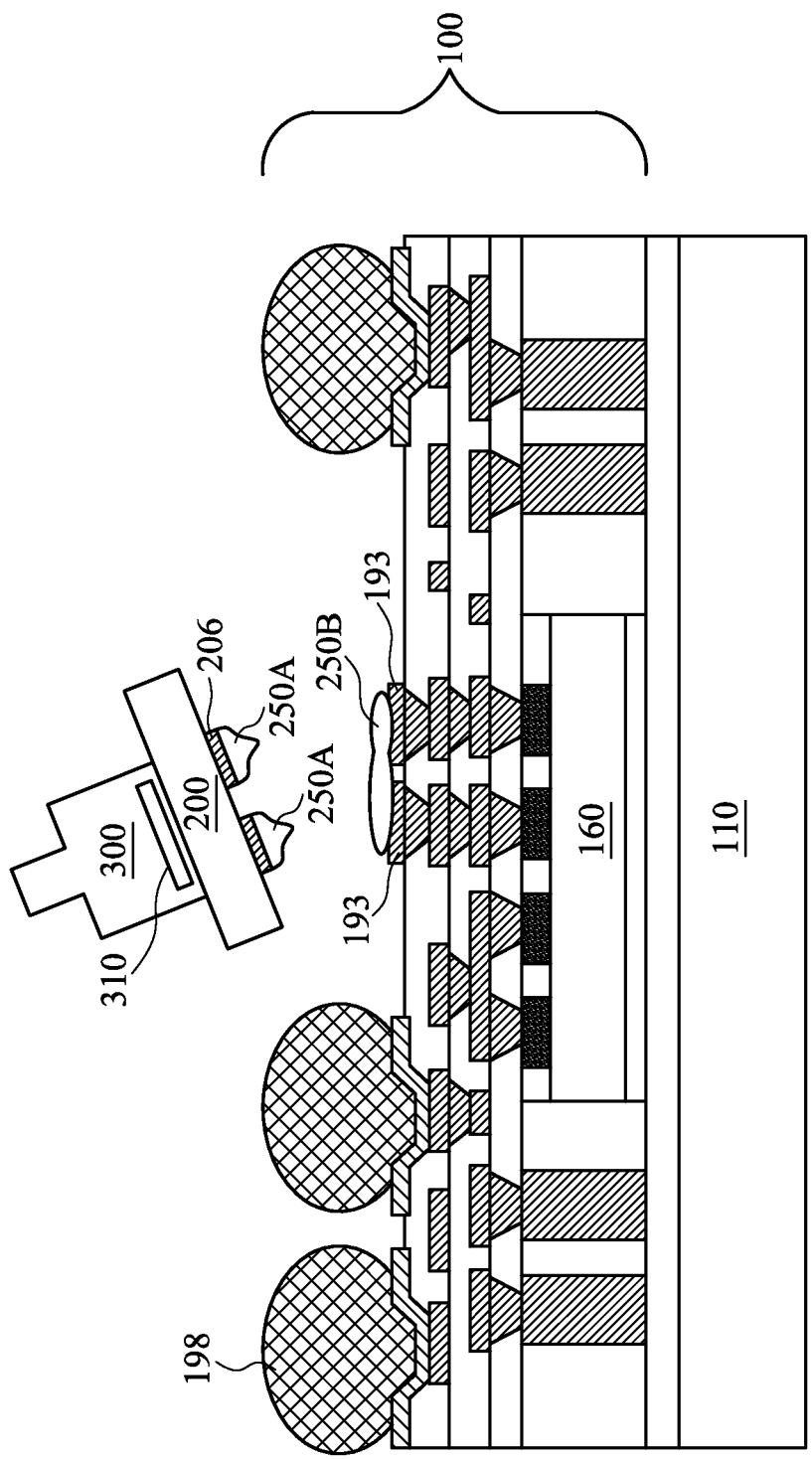

Next, as illustrated in FIG. 2, the IPD device 200 is removed from the micro bump pads 193 by the bond head 300. In some embodiments, portions of melted solder 250, labeled 250A in FIG. 2, adhere to the contact pads 206 of the IPD device 200 and are removed from the micro bump pads 193 with the removal of IPD device 200, while other portions of the melted solder 250, labeled 250B in FIG. 2, remain on the micro bump pads 193. As illustrated in the example of FIG. 2, the remaining portions of solder 250B may merge together and form solder bridge 250B, which will be removed/repaired in a subsequent solder removal process.

Figure 3A:
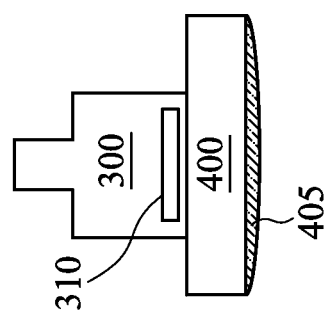
FIGS. 3A and 3A' illustrate cross-sectional views of rework tools at various stages of a rework process in accordance with some embodiments.
Figure 3A:
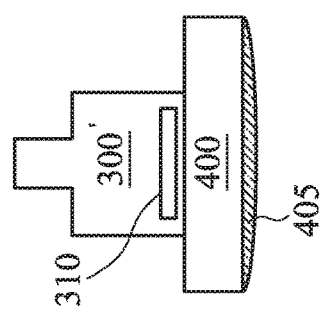

Referring to FIG. 3A. The bond head 300 is attached to a solder-wettable piece 400, in accordance with some embodiments. The solder-wettable piece 400 has good wettability for solder 250 and may comprise copper, silver, nickel, lead, gold, palladium, rhodium, cadmium, or other materials with good solder wettability, as examples. Solder wettability of a metal may vary depending on the composition of the solder, thus the choice of material for the solder-wettable piece 400 may be adjusted based on the specific solder used in different applications. In some embodiments, flux 405 is applied to the lower surface of the solder-wettable piece 400, by, e.g., dipping the solder-wettable piece 400 into flux using the bond head 300. In another embodiment, flux 405 is applied to the solder-wettable piece 400 before the bond head 300 attaches to the solder-wettable piece 400. In other embodiments, flux 405 is not used.

Figure 3B:
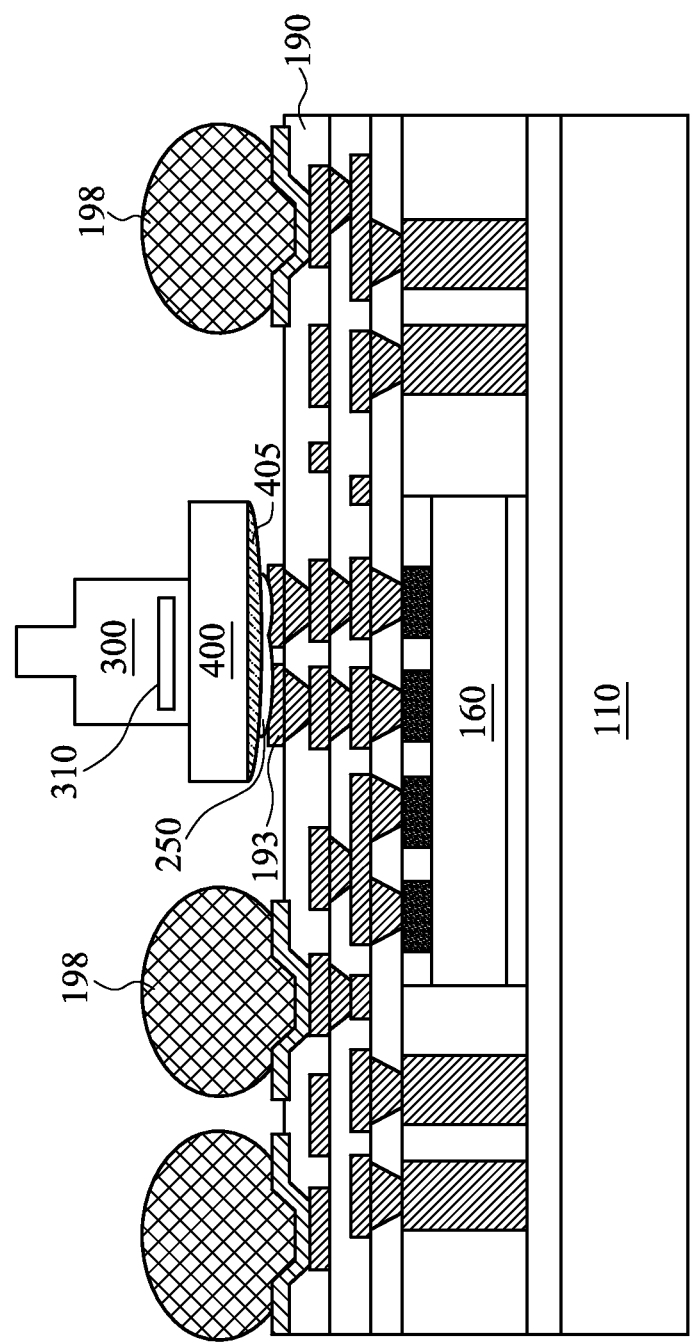
Figure 3B:
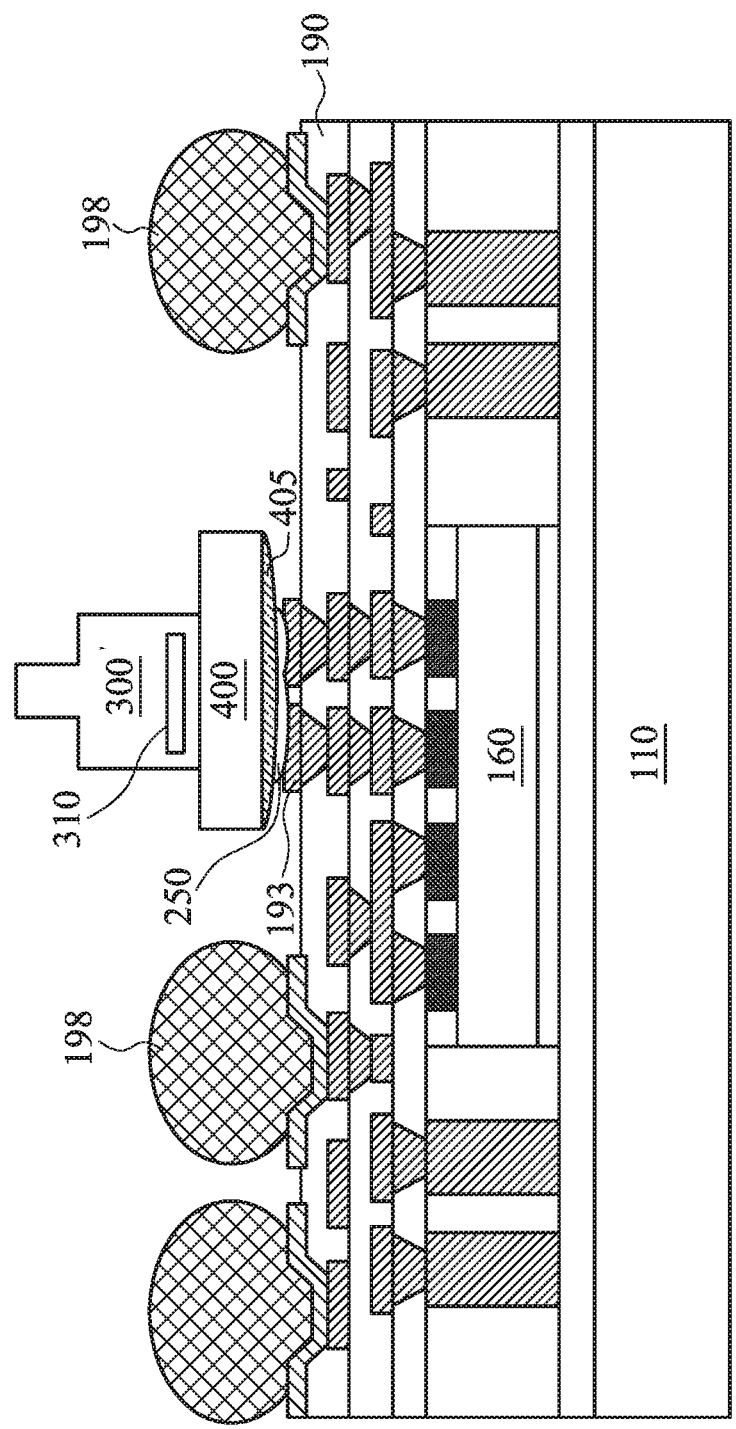

The solder-wettable piece 400 is about the same size as an area proximate the top surface of RDL 190 that is occupied by the micro bump pads 193, in accordance with some embodiments. The size of the solder-wettable piece 400 may be larger than the size of the area of the micro bump pads 193, but still fits in the rework area that is confined by components adjacent to the micro bump pads 193 (e.g., the area containing micro bump pads 130 and between two adjacent connectors 198, as shown in FIG. 3B), in some other embodiments. Solder-wettable piece 400 with a size same as or larger than an area occupied by the micro bump pads 193 allows for a one-step solder removal process in subsequent processing, as described below with reference to FIGS. 3B and 4.

Referring to FIG. 3B. A second local heating process is performed to melt solder 250, which is left on the micro bump pads 193 after the removal of the IPD device 200, in some embodiments. The second local heating process may be performed using heat source such as the built-in heating element 310 of the bond head 300, infrared radiation, hot air, laser, combinations thereof, or any other suitable heat source, as examples. One or more heat sources may be used for the second local heating process to melt solder 250.

As shown in FIG. 3B, the bond head 300 positions the solder-wettable piece 400 on the micro bump pads 193. In some embodiments, the solder-wettable piece 400 is pressed on the micro bump pads 193 by the bond head 300 and contacts solder 250 and/or micro bump pads 193. The second local heating process may start before, after, or at the moment when the solder-wettable piece 400 is positioned on the micro bumps 193, in accordance with some embodiments. In some embodiments, if solder 250 melted during the removal process of the IPD device 200 (illustrated in FIG. 2) remains melted or partially melted when the second local heating process is performed, the second local heating process may be performed with a time frame shorter than the time frame of the first local heating process, or, the second local heating process may be skipped (e.g., a zero time frame for the second local heating process) to save processing time if solder 250 remains melted.

There may be a time gap between the first and the second local heating processes, in some embodiments. For example, the first heating process may stop after the IPD device 200 is removed but before the second local heating process starts. As another example, the first and the second local heating processes may be two consecutive stages of a local heating process that overlaps with both the IPD device removal process and the solder removal process, thus the first and the second local heating processes are performed continuously without a time gap in between. For example, heat may be continuously applied throughout the first and the second local heating processes.

Figure 4:
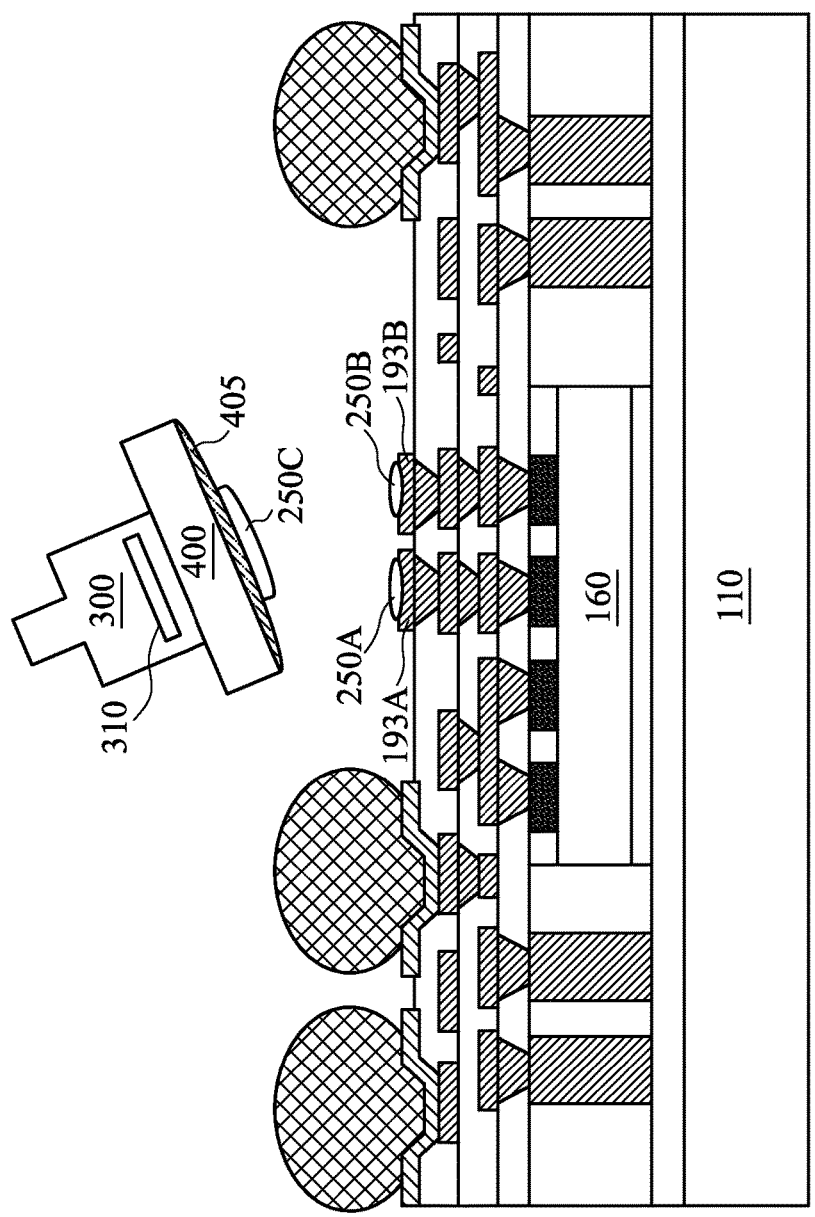
Figure 4:
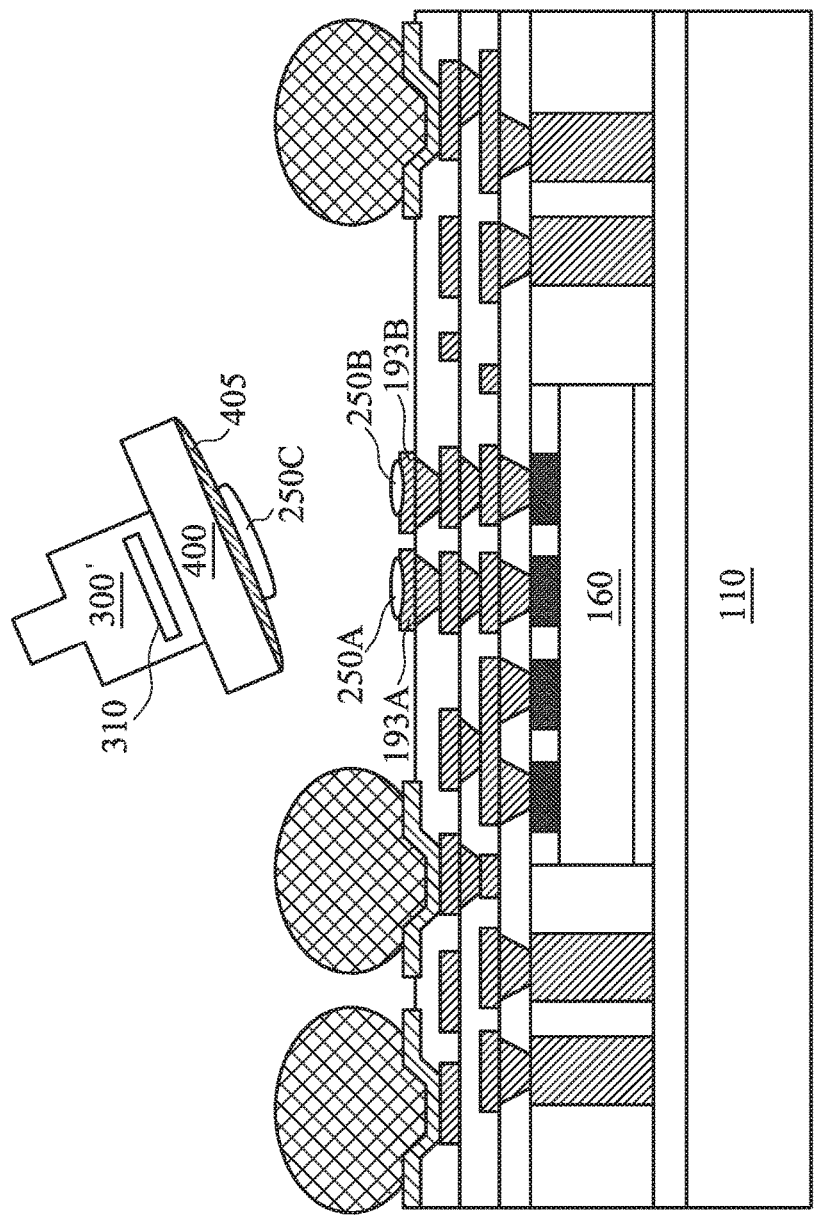

Next, as illustrated in FIG. 4, the bond head 300 removes the solder-wettable piece 400 from the micro bump pads 193 by, e.g., lifting the solder-wettable piece 400 up and moving the solder wettable-piece 400 away from the micro bump pads 193. A major portion of melted solder, labeled 250C in FIG. 4, adheres to the lower surface of the solder-wettable piece 400, thus is removed from the micro bump pads 193A/193B, in accordance with some embodiments. There might be a small amount of solder, labeled 250A and 250B in FIG. 4, that remain on micro bump pads 193A and 193B, respectively, as illustrated in the example of FIG. 4. The amount of solder 250A and 250B as shown in FIG. 4 may be exaggerated for illustration purpose. Since a major portion of solder on the micro bump pads 193A/193B is removed, the remaining portions of solder 250A and 250B are separate and do not form solder bridges, thus the micro bump pad 193 is ready for attaching an IPD device.

Portions of flux 405 may remain on the lower surface of the solder wettable piece 400, as illustrated in FIG. 4 (amount of flux 405 may be exaggerated in FIG. 4 for illustration purpose). In other embodiments, the lower surface of the solder-wettable piece 400 may be substantially free of flux 405 (not shown). FIG. 4 only shows two micro bump pads 193A and 193B, one skilled in the art will appreciate that the rework process described herein applies to packages with other numbers of micro bump pads 193 as well.

Since the solder-wettable piece 400 has a size same as or larger than the size of the micro bump pad area, the solder-wettable piece 400 covers the whole area of the micro bump pad area. This enables a simple and quick one-step solder removal process, where the solder-wettable piece 400 is pressed on the micro bump pad area and lifted up once to remove excessive solder from all micro bump pads 193. In contrast, a solder-wettable piece 400 with a size smaller than the micro bump pads area may require multiple press-and-lift operations, and solder 250C on the lower surface of the solder-wettable piece 400 may be cleaned after each press-and-lift operation.

In FIGS. 1, 2, 3A-B, and 4, one bond head 300 is used for attaching and moving both the IPD device 200 and the solder-wettable piece 400. However, as shown in FIGS. 3A', 3B', and 4', multiple bond heads 300 and 300' may be used to streamline the rework process and reduce the total repair time. For example, while a first bond head 300 attaches to the IPD device 200 during the IPD device removal process, a second bond head 300' attaches to the solder-wettable piece 400 and stands by. As soon as the IPD device 200 is removed from the micro bump pads 193, the second bond head 300' positions the solder-wettable piece 400 on the micro bump pads 193 for the solder removal process. Due to the shortened time delay between the removal of IPD device 200 and the positioning of the solder-wettable piece 400 on micro bump pads 193, solder 250 melted during the IPD device removal process may still be melted or partially melted, thus reducing the time needed to melt solder 250 during the solder removal process. As another example, the solder-wettable piece 400 may be heated by, e.g. the built-in heating element 310 of the second bond head 300', before the IPD device 200 is removed from the micro bump pad 193 by the first bond head 300, so that the solder-wettable piece 400 is already heated before being positioned on the micro bump pads 193, this may further reduce the total time required for the rework process.

Figure 5:
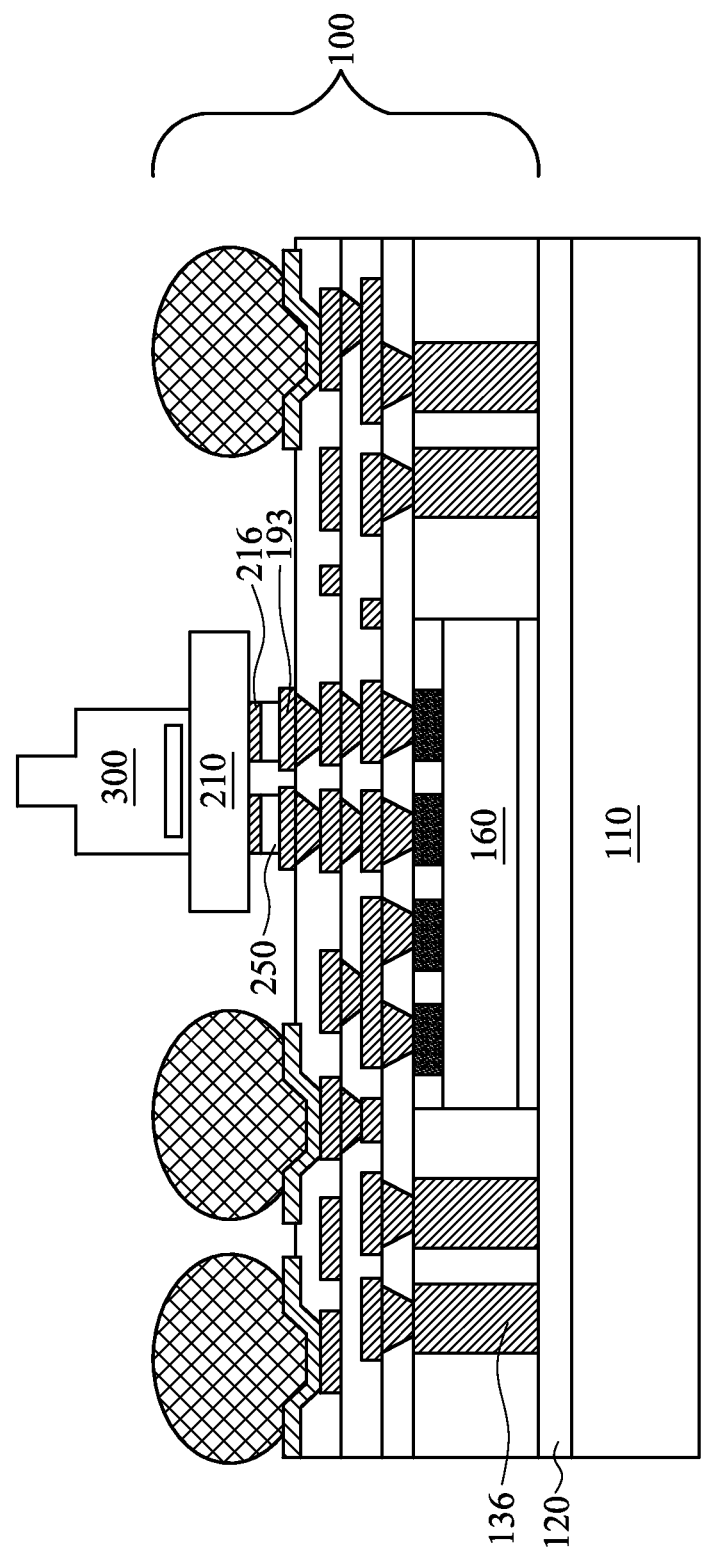

Next, referring to FIG. 5. The bonding heading 300 picks up a replacement IPD device 210 and attaches the IPD device 210 to micro bump pads 193 of the bottom package 100, in some embodiments. The IPD device 210 may be another IPD device of the same type as the IPD device 200 to replace a damaged IPD device 200, in accordance with some embodiments. The IPD device 210 may be the same IPD device 200 that was removed earlier to repair the solder bridges of the PoP package, if the IPD device 200 is determined to be functional and could be re-used, in some other embodiments. Once the IPD device 210 is attached to the micro bump pads 193, appropriate bonding methods, such as thermo compression bonding or reflow, may be used to bond the IPD device 210 to the bottom package 100. Although not shown in FIG. 5, an underfill material may be formed in the gap between the IPD device 210 and the bottom package 100.

Figure 6:
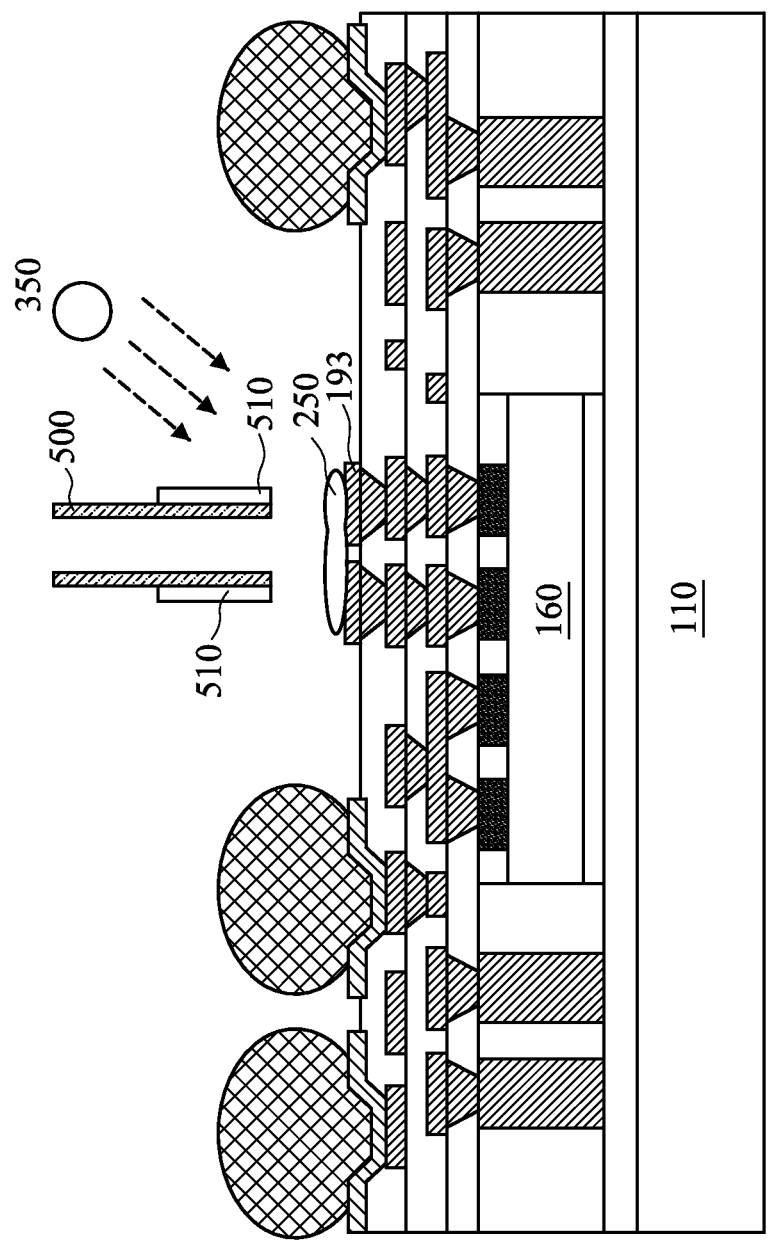
FIGS. 6 and 7 illustrate cross-sectional views of a PoP package and a rework tool at various stages of a rework process in accordance with some other embodiments.
Figure 7:
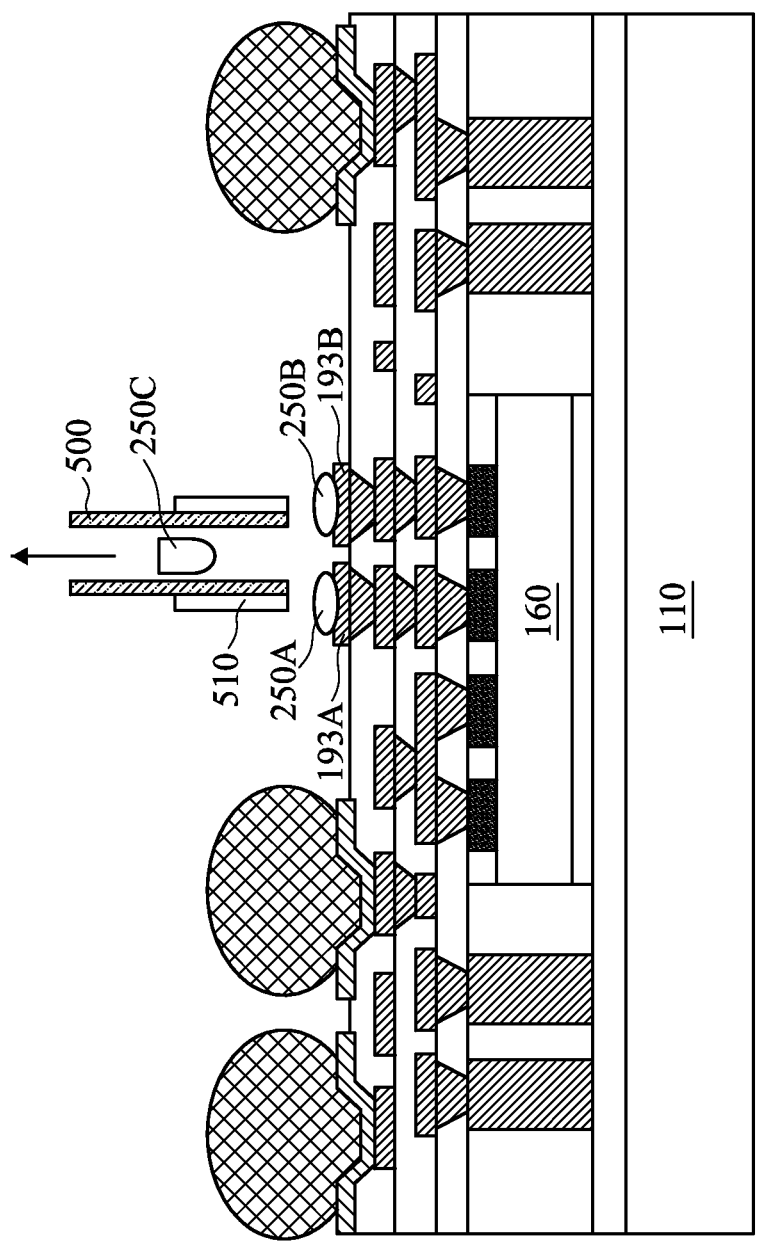

FIGS. 6 and 7 illustrate processing steps for another solder removal process, in some embodiments. For example, the processing illustrated in FIGS. 3A, 3B and 4 could be replaced by the processing illustrated in FIGS. 6 and 7.

Referring to FIG. 6. After the IPD device 200 is removed following the processing steps illustrated in FIGS. 1 and 2, a nozzle 500 supplied with a vacuum is lowered toward the micro bump pads 193, in accordance with some embodiments. A second local heating process is performed to melt solder 250 on the micro bump pads 193, in some embodiments. The nozzle 500 may have one or more built-in heating elements 510, such as electrical heating elements, for locally heating solder 250, in some embodiments. In addition to the built-in heating element of the nozzle 500, other appropriate source for local heating (see heat source 350 in FIG. 6), such as infrared radiation, hot air, and laser, may be used, individually or in combination, to melt solder 250. Local heating source 350 may not be shown in subsequent processes for clarity, but heat source 350 may or may not be used depending on the processing performed. The nozzle 500 may touch solder 250 for removing melted solder via suction, and the second local heating process may start before, after, or at the time when the nozzle 500 touches solder 250, in some embodiments. The nozzle 500 may be lowered toward solder 250 but stops at a location close to and above solder 250 during the solder removal process, and the second local heating process may start before or after the nozzle 500 stops at a lowest position (e.g., a position closet to solder 250). The second local heating process is performed with a shorter time frame than the time frame for the first local heating process, if solder 250 melted during the removal process of the IPD device 200 remains melted or partially melted when the second local heating processing is performed, or the second local heating process may be omitted (e.g., zero time frame for the second local heating process), in some embodiments.

Next, as illustrated in FIG. 7, at least a portion of the melted solder 250, labeled 250C in FIG. 7, is sucked into the nozzle 500 by vacuum and removed from micro bump pads 193. As described above, the nozzle 500 may directly contact melted solder, or it may be positioned above melted solder, in some embodiments. The vacuum may be supplied after solder 250 is melted, in some embodiments. Alternatively, the vacuum may be supplied before solder 250 is melted, in other embodiments. As shown in FIG. 7, small portions of solder 250, labeled 250A and 250B in FIG. 7, may remain on micro bump pads 193A and 193B, respectively. Since most of the melted solder 250 is removed by the nozzle 500, the remaining portions of solders (e.g., 250A and 250B in FIG. 7) are separate and do not form solder bridge. For large micro bump pad area, the nozzle 500 may traverse the area occupied by the micro bump pad 193 while the vacuum is supplied, removing melted solder 250 along the way, in accordance with some embodiments. Once micro bump pads 193 are processed by the nozzle 500 and are free of solder bridges, a replacement IPD device 210, which may or may not be the IPD device 200, can be bonded to the micro bump pads 193, details of which are similar to those discussed above with reference to FIG. 5.

Figure 8:
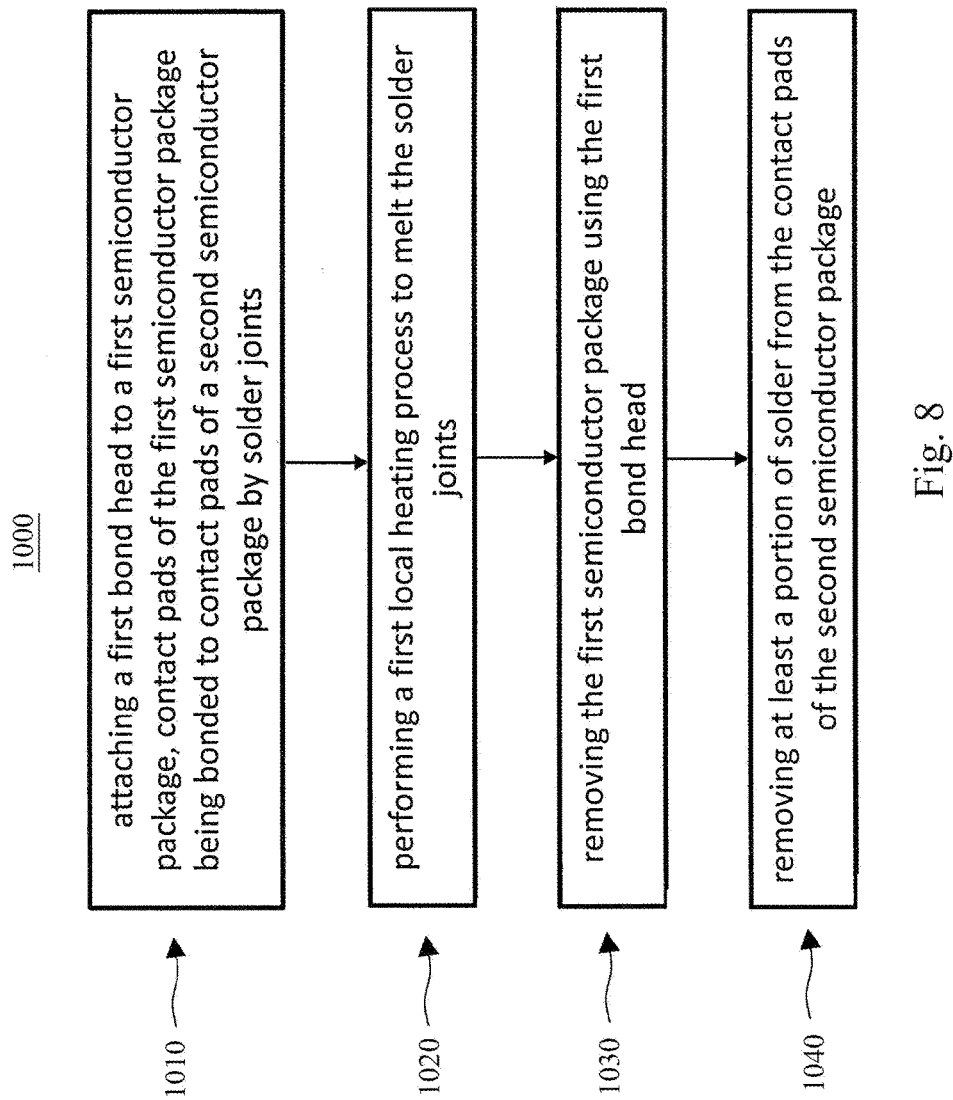
FIG. 8 illustrates a flow chart of a rework process, in accordance with various embodiments.

FIG. 8 illustrates a flow chart of a method for forming a rework process to repair a PoP semiconductor package, in accordance with various embodiments of the present disclosure. The flowchart shown in FIG. 8 is merely an example, which should not unduly limit the scope of the claims. One of ordinary skill in the art would recognize many variations, alternatives, and modifications. For example, various steps as illustrated in FIG. 8 may be added, removed, replaced, rearranged and repeated.

Referring to FIG. 8, at step 1010, a first bond head is attached to a first semiconductor package, contact pads of the first semiconductor package are bonded to contact pads of a second semiconductor package by solder joints. At step 1020, a first local heating process is performed to melt the solder joints. At step 1030, the first semiconductor package is removed using the first bond head. At step 1040, at least a portion of solder is removed from the contact pads of the second semiconductor package.

Embodiments of the device and methods in the current disclosure have many advantages. For example, the rework processes can be used to repair semiconductor packages with connection problems (e.g., solder bridge or cold joint) or damaged device (e.g., damaged IPD device 200), thus allowing re-use of good parts (e.g., properly functioning bottom packages 100 or IPD device 200). This might be economically beneficial, especially considering the high cost of some System-On-Chip (SoC) dies used in PoP packages. Although the rework processes and tools are disclosed with reference to a PoP package having a small IPD device attached to a bottom package, the rework processes and tools can be applied to many different semiconductor packages and applications. The rework processes can be easily applied to wafer level or unit level repair. In addition, the rework processes and tools can be incorporated into an automated tool chain, thus enabling automated rework processes.

In some embodiments, a rework process includes attaching a first bond head to a first semiconductor package. The contact pads of the first semiconductor package are bonded to contact pads of a second semiconductor package by solder joints. The rework process further includes performing a first local heating process to melt the solder joints, removing the first semiconductor package using the first bond head, and removing at least a portion of solder from the contact pads of the second semiconductor package.

In other embodiments, a rework tool comprises a local heating mechanism capable of heating a targeted area of a semiconductor package. The local heating mechanism is configured to perform a first local heating process to melt solder joints disposed between a first plurality of contact pads of a first semiconductor package and a second plurality of contact pads of a second semiconductor package. The rework tool also comprises a bond head supplied with a vacuum. The bond head is configured to remove the first semiconductor package after the solder joints are melted. The rework tool further comprises a solder removal tool. The solder removal tool is configured to remove solder from the second plurality of contact pads after the first semiconductor package is removed.

In yet another embodiment, a rework process includes performing a first local heating process to melt solder joints disposed between contact pads of a first semiconductor package and micro bump pads of a second semiconductor package, removing the first semiconductor package using a bond head attached to the first semiconductor package by a vacuum, and performing a second local heating process to melt solder on the micro bump pads. The rework process also includes performing a solder removal process to remove melted solder from the micro bump pads. The solder removal process removes solder bridges from the micro bump pads. The rework process further includes bonding a replacement semiconductor package to the micro bump pads.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A rework process comprising:
   attaching a first bond head to a first semiconductor package, contact pads of the first semiconductor package being bonded to contact pads of a second semiconductor package, wherein the second semiconductor package comprises a keep out zone less than about 150 µm, by solder joints;
   performing a first local heating process to melt the solder joints;
   removing the first semiconductor package using the first bond head;
   performing a second local heating process to melt the solder on the contact pads of the second semiconductor package, wherein the first local heating process and the second local heating process are performed continuously without a time gap in between;
   positioning a solder-wettable piece on the contact pads of the second semiconductor Package; and
   removing at least a portion of solder from the contact pads of the second semiconductor package by removing the solder-wettable piece from the contact pads of the second semiconductor package.

2. The rework process of claim 1, further comprising:
   after the removing at least a portion of solder from the contact pads of the second semiconductor package, bonding a third semiconductor package to the contact pads of the second semiconductor package, the third semiconductor package being of a same type as the first semiconductor package.

3. The rework process of claim 1, further comprising:
   after the removing at least a portion of solder from the contact pads of the second semiconductor package, bonding the first semiconductor package to the contact pads of the second semiconductor package.

4. The rework process of claim 1, wherein the performing the first and second local heating processes comprises melting the solder joints using a heat source selected from the group consisting essentially of an infrared radiation source, a hot air, a laser, and combinations thereof.

5. The rework process of claim 1, wherein the positioning the solder-wettable piece and the removing the solder-wettable piece are performed using a second bond head attached to the solder-wettable piece.

6. The rework process of claim 1, wherein the positioning the solder-wettable piece and the removing the solder-wettable piece are performed using the first bond head.

7. The rework process of claim 1, further comprising:
   before the positioning the solder-wettable piece on the contact pads of the second semiconductor package, applying flux on a lower surface of the solder-wettable piece.

8. A rework process comprising:
   performing a first local heating process to melt solder joints disposed between contact pads of a first semiconductor package and micro bump pads of a second semiconductor package, wherein the second semiconductor package comprises a keep out zone less than about 150 µm;
   removing the first semiconductor package using a bond head attached to the first semiconductor package by a vacuum;
   performing a second local heating process to melt solder on the micro bump pads, wherein the first and the second local heating processes comprise a continuous local heating process, the continuous local heating process lasting throughout the step of removing the first semiconductor package and the following solder removal process;
   performing a solder removal process to remove melted solder from the micro bump pads, the solder removal process removing solder bridges from the micro bump pads; and
   bonding a replacement semiconductor package to the micro bump pads.

9. The rework process of claim 8, wherein the performing the solder removal process comprises:
   contacting a solder-wettable piece with the melted solder on the micro bump pads; and
   removing the solder-wettable piece from the micro bump pads.

10. The rework process of claim 1, wherein the second local heating process is performed for a shorter period of time than the first local heating process.

11. The rework process of claim 5, wherein the solder-wettable piece is heated by a built-in heating element of the second bond head before the second local heating process.

12. The rework process of claim 9, further comprising applying flux to a surface of the solder-wettable piece before contacting the solder-wettable piece with the melted solder.

13. A rework process comprising:
   performing a first heating process to melt solder joints disposed between contact pads of a first device and contact pads of a second device, wherein the second semiconductor package comprises a keep out zone less than about 150 µm and wherein melted solder joints form a solder region;
   removing the first device from the second device, wherein portions of the solder region remain on the contact pads of the second device after removing the first device;
   performing a second heating process to heat the solder region after removing the first device, such that the first and the second heating processes comprise a continuous local heating process; and reducing a volume of the solder region on the contact pads of the second device using a solder-wettable piece attached to a first bond head.

14. The rework process of claim 13, wherein reducing the volume of the solder region comprises:

contacting the solder-wettable piece with the solder region; and moving the solder-wettable piece away from the second device after contacting the solder-wettable piece with the solder region.

15. The rework process of claim 13, further comprising attaching a third device to the contact pads of the second device after reducing the volume of the solder region.

16. The rework process of claim 1, wherein the solder-wettable piece comprises Cu, Ag, Ni, Pb, Au, Pd, Rh, or Cd.

17. The rework process of claim 1, wherein the solder-wettable piece is about the same size as an area proximate the top surface of the second semiconductor package that is occupied by the contact pads of the second semiconductor package.

18. The rework process of claim 8, wherein the first local heating process is performed at a temperature from a melting point of the solder to a temperature about 60° C. to 80° C. above the melting point of the solder.

19. The rework process of claim 8, wherein the first local heating process is performed for about 1 second to about 60 seconds.

20. The rework process of claim 13, wherein the solder-wettable piece is dipped into flux using the first bond head prior to reducing the volume of the solder region.

* * * * *